United States Patent
Han et al.

(10) Patent No.: US 7,509,547 B1
(45) Date of Patent: Mar. 24, 2009

(54) SYSTEM AND METHOD FOR TESTING OF INTERCONNECTS IN A PROGRAMMABLE LOGIC DEVICE

(75) Inventors: Ui Sun Han, Santa Clara, CA (US); Walter N. Sze, Lake Oswego, OR (US)

(73) Assignee: Xilinx, Inc., San Jose, CA (US)

( * ) Notice: Subject to any disclaimer, the term of this patent is extended or adjusted under 35 U.S.C. 154(b) by 616 days.

(21) Appl. No.: 11/220,924

(22) Filed: Sep. 7, 2005

(51) Int. Cl.
*G01R 31/28* (2006.01)
*G01R 27/28* (2006.01)
*G01R 31/00* (2006.01)
*G01R 31/14* (2006.01)
*G11C 29/00* (2006.01)
*G06F 17/50* (2006.01)
*G06F 9/45* (2006.01)
*G06F 9/455* (2006.01)
*H03K 17/693* (2006.01)
*H03K 19/00* (2006.01)

(52) U.S. Cl. ............... 714/725; 714/724; 714/742; 714/719; 714/736; 714/737; 714/733; 714/734; 716/17; 716/16; 716/18; 716/8; 716/10; 716/12; 702/117; 702/118; 702/119; 702/120

(58) Field of Classification Search .................. None
See application file for complete search history.

(56) References Cited

U.S. PATENT DOCUMENTS

| | | | |
|---|---|---|---|
| 5,889,970 A * | 3/1999 | Horan et al. ............... 710/312 |
| 6,574,761 B1 * | 6/2003 | Abramovici et al. ........ 714/725 |
| 6,651,238 B1 * | 11/2003 | Wells et al. .................... 716/16 |
| 6,687,884 B1 * | 2/2004 | Trimberger .................... 716/4 |
| 6,973,608 B1 * | 12/2005 | Abramovici et al. ........ 714/725 |
| 7,058,534 B1 * | 6/2006 | Tracy et al. .................. 702/117 |
| 7,145,344 B2 * | 12/2006 | Mark et al. .................. 324/525 |
| 7,194,666 B1 * | 3/2007 | Wong et al. ................. 714/704 |
| 2002/0078412 A1 * | 6/2002 | Wang et al. .................. 714/732 |
| 2004/0103354 A1 * | 5/2004 | Mark et al. .................. 714/725 |

OTHER PUBLICATIONS

Xilinx, Inc.; "Virtex-II Pro Platform FPGA Handbook"; published Oct. 14, 2002; available from Xilinx, Inc., 2100 Logic Drive, San Jose, California 95124; pp. 19-71.

* cited by examiner

*Primary Examiner*—Cynthia Britt
*Assistant Examiner*—Guerrier Merant
(74) *Attorney, Agent, or Firm*—LeRoy D. Maunu

(57) ABSTRACT

Methods and systems provide for early and simplified testing for defects in the interconnects of a programmable logic device (PLD) and in associated software tools. Data that describes the interconnects are read from a database for the PLD. For each interconnect, a respective test design is automatically generated with the test design replacing a portion of a coupling between an input pad and an output pad in an archetypal test design with a coupling that includes the interconnect. A respective configuration is automatically generated for the PLD from each test design. A respective operation of the PLD programmed with each configuration is simulated, and each operation of the PLD for is checked inconsistency with an expected result. In response to any inconsistency, an indication of the inconsistency is displayed to a user.

19 Claims, 6 Drawing Sheets

SYSTEM AND METHOD FOR TESTING OF INTERCONNECTS IN A PROGRAMMABLE LOGIC DEVICE

FIELD OF THE INVENTION

The present invention generally relates to verification of integrated circuits, and more particularly to verification of software models of programmable logic devices.

BACKGROUND

Programmable logic devices (PLDs) may be programmed to implement a wide variety of user designs. A PLD is programmed to implement a particular user design by loading a configuration generated from a specification of the user design into the PLD. The PLD includes configurable logic and routing resources that implement the user design when programmed with the configuration. The configurable logic resources may be programmed to implement a variety of functions and the configurable routing resources may be programmed to implement a variety of connections within the PLD.

Development of a PLD itself requires specifying the design of the PLD, including specifying the design of the programmable routing resources. The design of a PLD may be specified by schematics of the circuit connections of the PLD. Development of a PLD also generally requires updating of software tools used to translate a user design into a configuration for the PLD. A separate interconnection model may be developed to provide an abstract software model of the programmable routing resources. Thus, various aspects of the PLD related to programmable routing resources may have three separate representations, a schematic representation of the programmable routing resources, a software representation within the tools used to translate a user design into a configuration, and an interconnection model for high-level modeling.

Inconsistencies between these representations of the programmable routing resources may prevent the successful translation of a particular user design into a configuration for the PLD. Such inconsistencies may be discovered prior to fabrication of the PLD and during development of a production test suite for the PLD. However, development of the production test suite may be delayed until the design of the PLD is completed or nearly completed. Furthermore, evaluation of test coverage of the production test suite may be delayed until production testing begins for the fabricated PLD. Thus, certain inconsistencies, such as an inconsistency that is not tested by the production test suite as discovered during evaluation of test coverage of the production test suite, may remain undiscovered until fabricated PLDs become available. The isolation and correction of inconsistencies discovered using fabricated PLDs may be expensive and time-consuming. In addition, shipment of the fabricated PLDs to users may be delayed until these inconsistencies are resolved.

The present invention may address one or more of the above issues.

SUMMARY OF THE INVENTION

Various embodiments of the invention provide a method for testing interconnects of a programmable logic device (PLD). Data describing a subset of interconnects are read from a database for the PLD. For each interconnect, a respective test design is automatically generated with the test design replacing a portion of a coupling between an input pad and an output pad in an archetypal test design with a coupling that includes the interconnect. A respective configuration is generated for the PLD from each test design. A respective operation of the PLD programmed with each configuration is simulated, and each operation of the PLD for is checked inconsistency with an expected result.

Various other embodiments of the invention provide a system for testing interconnects of a programmable logic device (PLD). The system includes a database, a first generator of test designs, a second generator of configurations, a simulator, and a checker. The database for the PLD includes data descriptive of the interconnects. The first generator generates a respective test design for each of the interconnects of the subset of interconnects that replaces a portion of a coupling between an input pad and an output pad in an archetypal test design with a coupling that includes the interconnect. The generator of configurations generates a respective configuration for the PLD from each of the test designs. The simulator simulates a respective operation of the PLD programmed with each of the configurations. The checker checks for inconsistency of each of the operations of the PLD with an expected result. In response to any inconsistency, an indication of the inconsistency is displayed on a user interface of the at least one general purpose computer.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
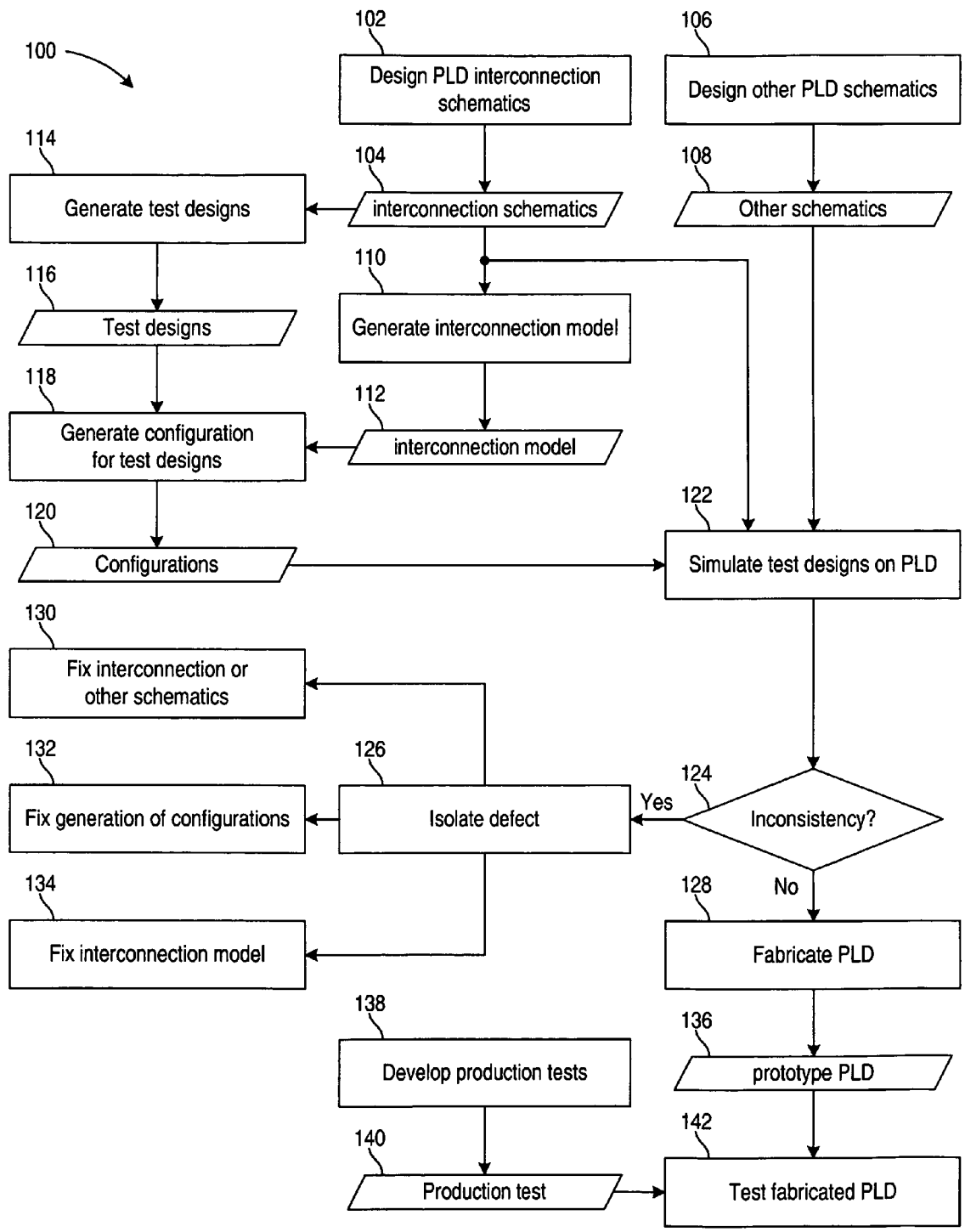
FIG. 1 is a flow diagram of a process for developing a PLD in accordance with various embodiments of the invention.

FIG. 1 is a flow diagram of a process 100 for developing a PLD in accordance with various embodiments of the invention. A PLD may be developed by generating schematics for the design of the PLD, testing the design of the PLD by simulating the operation of the PLD, fabricating the PLD, and testing the fabricated PLD. Development of a PLD may also include development of software tools that support usage of the PLD, such as software tools that translate a user design into a configuration that implements the user design in the PLD when the PLD is programmed with the configuration.

A PLD may be composed of an array of tiles that include programmable logic and routing resources. At step 102, interconnection schematics 104 are designed that specify the programmable routing resources of the PLD. At step 106, schematics 108 for the other parts of the PLD, such as the programmable logic resources, are designed.

The interconnection schematics 104 may be used at step 110 to generate an interconnection model 112. The generation of the interconnection model 112 may include manual steps to form an abstract software model of the programmable routing resources provided by the interconnection schematics 104. These manual steps or other steps may introduce errors, such that the high-level interconnection model 112 does not properly describe the interconnection schematics 104. The software tools that translate a user design into a configuration for the PLD may use the interconnection model 112 to specify the various interconnects of the PLD that may be used to implement the user design. The configuration generated for a user design may be incorrect when the interconnection model 112 is defective. In addition, the configuration generated for a user design may be incorrect for a flawless interconnection model 112 when the software translation tools are defective.

Various embodiments of the invention generate test designs for interconnects on the PLD. A database, such as the interconnection schematics 104 or a database generated from the interconnection schematics 104, may be queried to list every interconnect in the PLD or a specific subset of the interconnects in the PLD, such as all the interconnect in a particular programmable routing resource. At step 114, test designs 116 may be generated for a selected set of interconnects in the PLD. Each selected interconnect may tested using a respective one of test designs 116. At step 118, the software tools that translate a user design into a configuration may be used to translate the test designs 116 into corresponding configurations 120.

At step 122 a simulation of the PLD may be a behavioral simulation that uses the hardware description language specification of the PLD provided by the interconnection schematics 104 and the other schematics 108. In one embodiment, the simulation of the PLD begins with a reset of the PLD, and following reset the simulated PLD loads a configuration from an internal or external source into configuration memory of the PLD. The simulation may load one of the configurations 120 into the configuration memory of the PLD to program the PLD to implement a corresponding one of test designs 116. Following the programming of the PLD, the PLD may begin to operate according to the loaded configuration. Each of test designs 116 may a corresponding one of configurations 120 that is simulated by a separate simulation.

The simulation of the operation of the PLD may take a significant amount of simulation time, such that separately simulating a test design for each interconnect of the PLD may be impractical. In one embodiment, the configuration loaded is a partial configuration that leaves most of configuration memory of the PLD in the default state that follows reset. In another embodiment, simulation of the loading of the configuration may be skipped to improve simulation throughput. Instead of simulating a configuration sequence following reset that loads the configuration into the PLD, the configuration may be directly loaded into the proper configuration memory cells using simulator commands for some or all of the test designs. However, it will be appreciated that certain defects may be undiscoverable when a configuration is directly loaded into configuration memory cells.

The amount of simulation time may be reduced by simulating a representative subset of the interconnects of the PLD. In one embodiment, the PLD has a limited number of types of interconnection elements, and the interconnects tested are limited to all the interconnects within one representative of each type of element. In another embodiment, the interconnects tested are limited to all the interconnects of each type of element, with each interconnect for a particular type of element tested using a distinct one of the particular type of element in the PLD (to the extent that the number of elements of a particular type in the PLD exceeds the number of interconnects within the particular type of element). In yet another embodiment, one interconnect is tested for each element of the PLD. It will be appreciated that interconnect testing may use a combination of the above embodiments.

Decision 124 checks whether the simulation of any test design exhibits an inconsistency with expected results. For an inconsistency, process 100 proceeds to step 126 and otherwise process 100 proceeds to step 128. At step 126, the defect causing the inconsistency is isolated. Isolation of a defect may be a manual process performed by a designer of the PLD. The isolated defect may be a defect in the interconnect schematics 104 or other schematics 108, and the defect may be fixed at step 130. The isolated defect may also be a defect in software tools used to generate a configuration from a user design, or, at step 118, to generate configurations 120 from test designs 116. At step 132, the isolated defect in these software tools may be fixed. In addition, the isolated defect may be a defect in the interconnection model 112, and the defect may be fixed at step 134. After fixing one or more defects, process 100 may be repeated until decision 124 indicates that inconsistency is no longer present in the simulation of any test design.

At step 128, the tested PLD is fabricated to produce prototype PLD 136. At step 138, production tests 140 may be developed. In certain embodiments of the invention, some or all of the test designs 116 may be included in a production test 140 for testing the fabricated PLD at step 142. Alternatively, some or all of the test designs 116 may be used to test the fabricated PLD at step 142 until a production test 140 becomes available.

Figure 2:
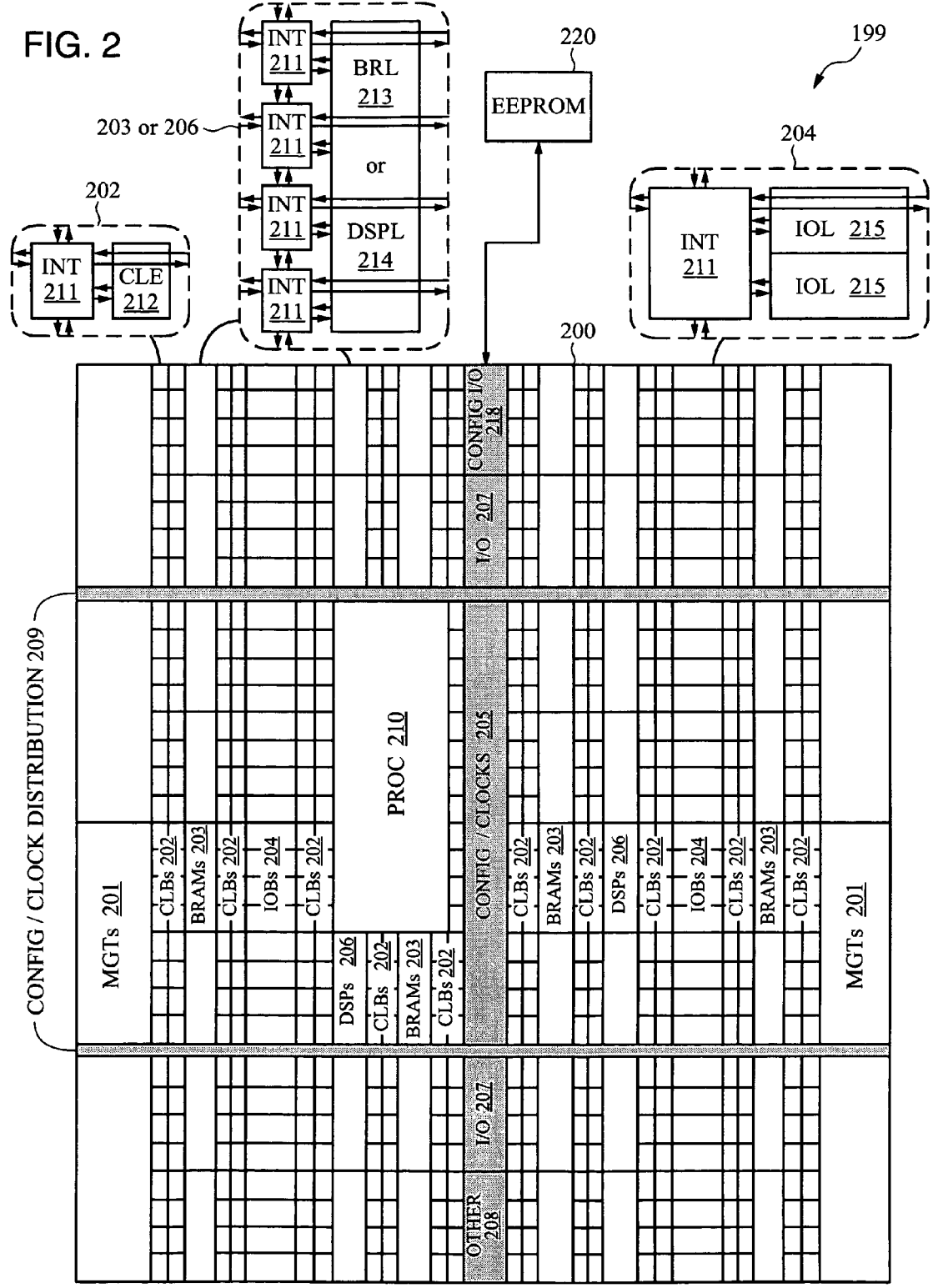
FIG. 2 is a block diagram of a PLD arrangement in accordance with various embodiments of the invention.

FIG. 2 is a block diagram of a PLD arrangement 199 in accordance with various embodiments of the invention. The PLD 200 may be programmed with a configuration from the EEPROM 220 during reset of the PLD 200. The configuration from EEPROM 220 may program PLD 200 to implement a user design.

Certain PLDs, such as advanced FPGAs, can include an array of programmable tiles having several different types of programmable logic and routing resources. For example, FIG. 2 illustrates a PLD 200 with an FPGA architecture that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., clock ports), configuration I/O port 218, and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnection element (INT 211) having standardized connections to and from a corresponding interconnection element in each adjacent tile. Therefore, the programmable interconnection elements taken together may implement the programmable interconnect structure for the illustrated FPGA. The programmable interconnection element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnection element (INT 211). A BRAM 203 can include a BRAM logic element (BRL 213) in addition to one or more programmable interconnection elements. Typically, the number of interconnection elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnection elements. An IOB 204 can include, for example, two instances of an input/output logic element (IOL 215) in addition to one instance of the programmable interconnection element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA. A configuration from EEPROM 220 may be loaded into configuration memory cells in the programmable logic and routing resources 201, 202, 203, 204, 206, and 208 via configuration I/O port 218, CONFIG/CLOCKS 205, and the configuration distribution signals of areas 209.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

One such FPGA, the Xilinx Virtex-II Pro FPGA, is described in detail in pages 19-71 of the "Virtex-II Pro Platform FPGA Handbook", published Oct. 14, 2002 and available from Xilinx, Inc., 2100 Logic Drive, San Jose, Calif. 95124, which pages are incorporated herein by reference.

Figure 3:
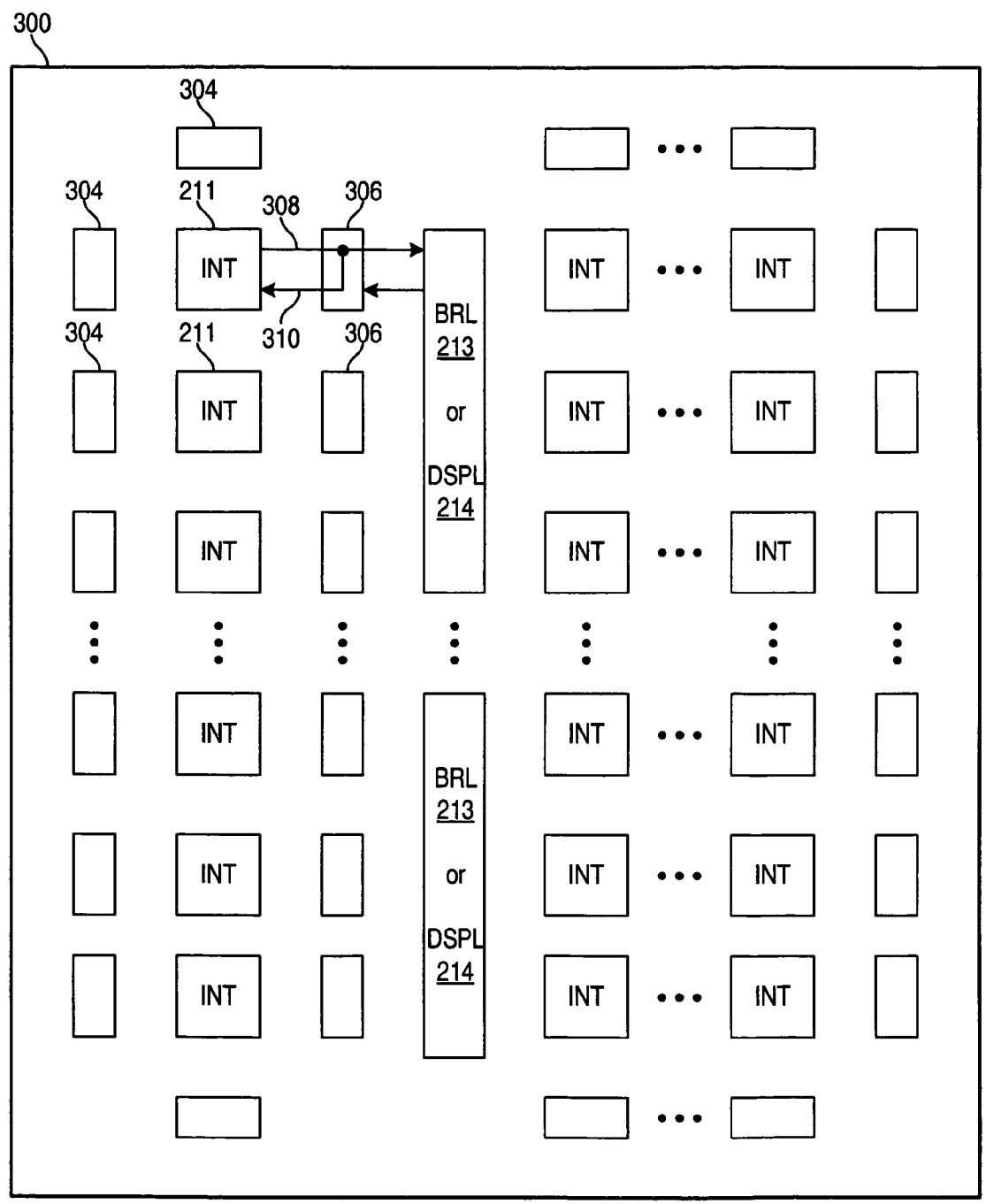
FIG. 3 is a block diagram of an example PLD illustrating various types of interconnection elements in accordance with various embodiments of the invention.

FIG. 3 is a block diagram of an example PLD 300 illustrating various types of interconnection elements in accordance with various embodiments of the invention. Programmable interconnection elements may include interior interconnection elements 211, termination elements 304, and test elements 306. Interior elements 211 may be included within programmable tiles, such as programmable tiles 202, 203, 204, and 206 of FIG. 2. In other PLDs, similar interior elements may themselves be programmable tiles.

Interior elements 211 near the center of the PLD 300 may form connections with adjacent interior elements 211 that are to the left, right, above, and below. In addition, interior elements 211 near the center of the PLD 300 may form connections with various logic elements, such as block RAM logic elements 213 and DSP logic elements 214, that are to the left and/or right. The interior elements 211 around the periphery of PLD 300 may not have an adjacent logic element and/or an adjacent interior element on one or more outer sides. Rather than leaving unconnected the connections to the outer sides of the interior elements 211 around the periphery of PLD 300, these connections may instead be connected to termination elements 304. Each one of termination elements 304 may be programmable to couple inputs and outputs of an adjacent one of interior elements 211. A configuration for a user design may program certain termination elements 304 to couple an output of an adjacent interior element to one or more inputs of the adjacent interior element, for example, to increase the fanout of the output of the adjacent interior element.

A PLD 300 may include test elements 306. Test elements 306 may be included in a PLD 300 to provide feedback paths that accelerate production testing of the PLD. Testing the connection 308 between interior elements 211 and a block RAM elements 213, without using the feedback of the test elements 306, may require that the block RAM elements are programmed with specific values. Because a large amount of data may be required to program a block RAM with the specific values, testing the connection 308 using the block RAM may require a significant amount of testing time. Feedback path 310 may allow connection 308 to be tested without programming the block RAM elements 213. Test element 306 may be programmable to provide normal connections or feedback connections.

Because the feedback connections of test elements 306 may not be useful for implementing a user design in PLD 300, the test elements 306 may provide interconnects that are hidden from a user. In contrast, the interconnects provided by interior elements 211 and termination elements 304 may be visible to a user for usage by a user design. It will be appreciated that elements 211, 304, 306, and other elements may contain both user-visible and user-hidden interconnects.

Figure 4:
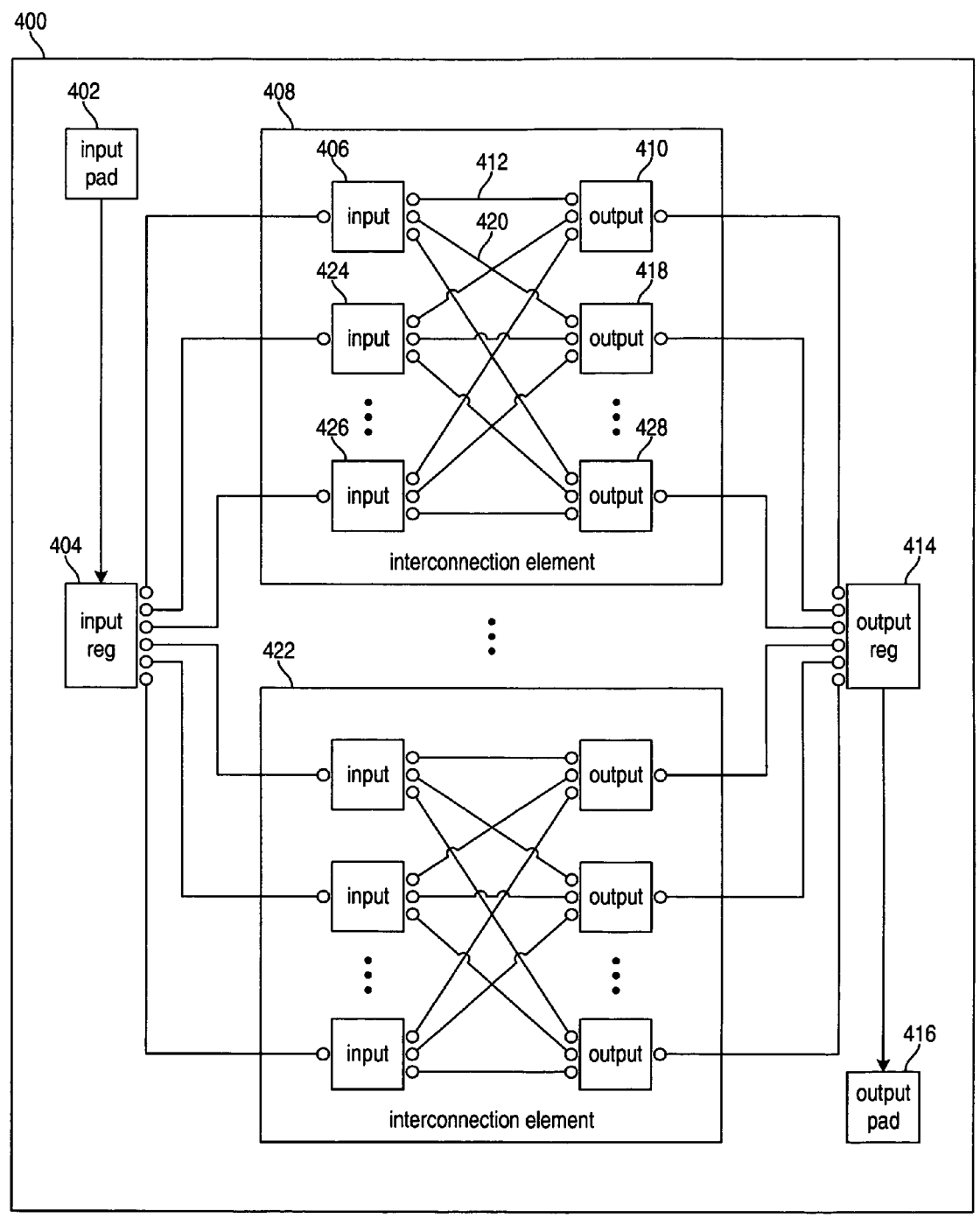
FIG. 4 is a block diagram of an example PLD illustrating usage of an archetypal test design to test various interconnects in the PLD in accordance with various embodiments of the invention.

FIG. 4 is a block diagram of an example PLD 400 illustrating usage of an archetypal test design to test various interconnects in the PLD in accordance with various embodiments of the invention. Certain interconnects of the archetypal test design may be replaced with a test interconnect to generate a test design for verifying the test interconnect and various software tools and models.

The archetypal test design may couple input pad 402 to input register 404, input register 404 to input 406 of interconnection element 408, input 406 to output 410 via interconnect 412, output 410 of interconnection element 408 to output register 414, and output register 414 to output pad 416. The functional operation of the archetypal test design may be to propagate values from input pad 402 to the output pad 416. The values supplied to the input pad 402 are propagated to the output pad 416 after a delay, introduced by registers 404 and 414, of two periods of a clock (not shown). Thus, the proper operation of the archetypal test design is that the values provided to input pad 402 are generated at output pad 416 with a delay of two clock periods. The data provided to the input pad 402 may be random data or other data.

Inconsistency may be detected during simulation of the PLD 400 programmed to implement the archetypal test design when the values generated by PLD 400 at output pad 416 are different from the values provided to PLD 400 at input pad 402. An inconsistency with the expected result may be caused by an improper connection of one or more interconnects, such as interconnect 412, within the PLD 400. The improper connection may be caused by a defect in the design of the PLD 400 and/or a defect in the generation of the configuration for the PLD. The configuration for the archetypal test design may be incorrectly generated because of a defect in software tools used to generate the configuration from the archetypal test design and/or a defect in an interconnection model used by these software tools.

An inconsistency detected during simulation has the symptoms that the values generated at output pad 416 are different from the values provided at input pad 402. Examination of the simulation exhibiting the symptoms may be useful to isolate the defect causing the inconsistency. Determining the defect causing the inconsistency may be expedited because of the archetypal test design is very simple. The propagation of values from the input pad 402 to the output pad 416 may be traced in the simulation until the point of propagation failure is discovered. Although a large number of simulations may need to be executed to test the interconnects or a representative portion of the interconnects in the PLD 400, the development schedule for a PLD may be shortened despite the potentially large amount of simulation time needed for the large number of simulations.

The configuration for the archetypal test design may use only a small portion of the PLD 400 because of the simplicity of the archetypal test design. In certain embodiments, the simulation of the PLD 400 may include simulating the resetting the PLD followed by simulating the loading of the configuration for the archetypal test design into configuration memory of the PLD. The simulation time to load the configuration into the PLD 400 may be reduced by loading a partial configuration that initializes only the configuration memory controlling the small portion of the PLD that is used by the archetypal test design.

The archetypal test design may be modified to test other interconnect of PLD 400. For example, instead of coupling input 406 of interconnection element 408 to output 410 via interconnect 412, input 406 may be coupled to output 418 via interconnect 420; and instead of coupling output 410 of interconnection element 408 to output register 414, output 418 of interconnection element 408 may be coupled to output register 414. The interconnect 420 may be tested using the archetypal test design modified in this manner. Other interconnects may be tested by modifications of the archetypal test design that similarly replace interconnect 412 of interconnection element 408 with another interconnect of interconnection element 408 or another interconnection element 422.

Generally, an interconnection element 408 may be characterized by arcs indicating the possible connections between the inputs 406, 424, and 426 and the outputs 410, 418, and 428 that the interconnection element 408 may be programmed to implement. Interconnection element 408 is shown having all possible connections between inputs 406, 424, and 426 and the outputs 410, 418, and 428. It will be appreciated that certain interconnection elements may allow fewer connections. An example interconnection element 408 may include a multiplexer circuit associated with each output 410, 418, and 428. Each multiplexer circuit may include multiple levels of 2-to-1 multiplexer gates, with each multiplexer controlled by a respective bit of the configuration memory of the PLD 400.

A PLD 400 may include multiple identical interconnection elements 408 and 422 of a particular type. Certain possible defects, such as a defect in the schematic design for a type of interconnection element, may affect every interconnection element of that type in the PLD 400. Thus, these defects may be detected by a thorough testing of a representative one of these interconnection elements. In contrast, fabrication defects of a fabricated PLD may be located in any interconnection element, and a production test for the PLD should exhaustively test every interconnect of every interconnection element. However, the simplicity of the test designs generated by modifying the archetypal test design may be useful during the initial testing of fabricated prototype PLD. In addition, these test designs may also be included in a production test suite for the PLD. Such a production test suite may include programming the PLD with the configuration for each of the test designs and then checking the actual operation of the PLD.

Figure 5:
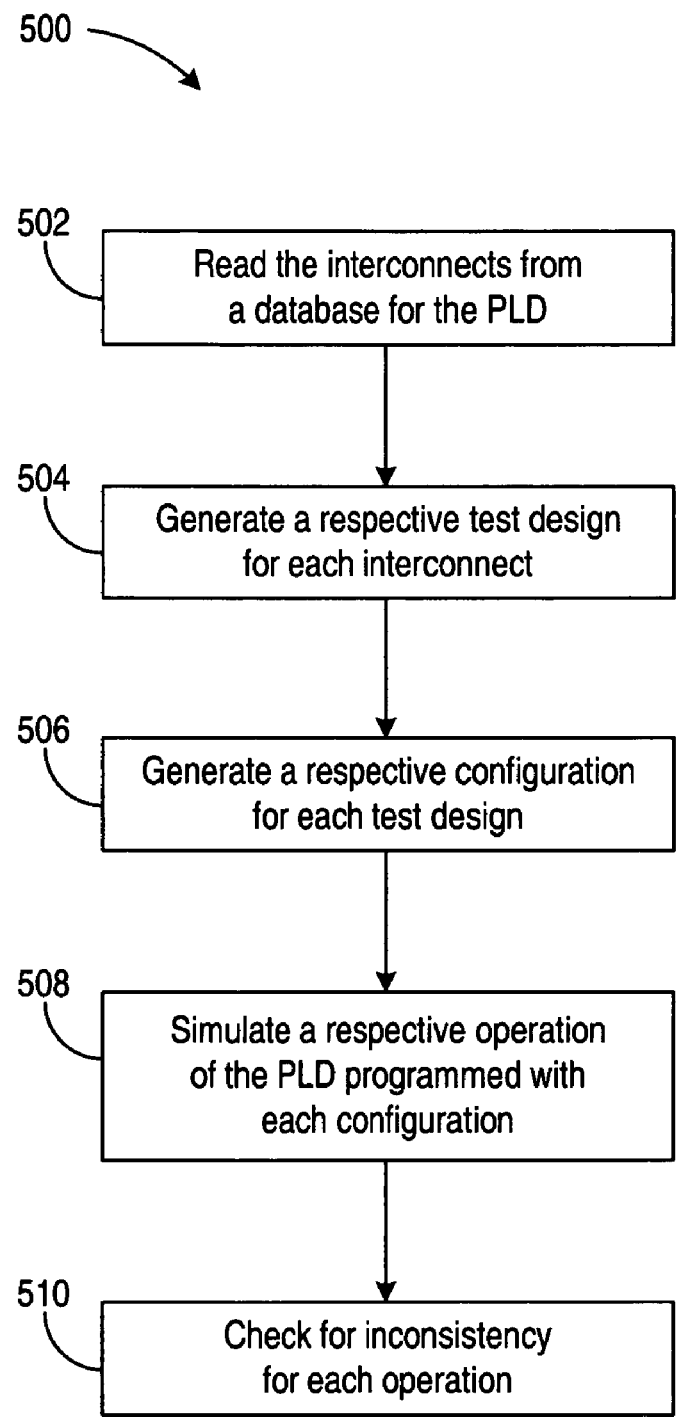
FIG. 5 is a flow diagram of a process for testing interconnects of a PLD in accordance with various embodiments of the invention.

FIG. 5 is a flow diagram of a process 500 for testing interconnects of a PLD in accordance with various embodiments of the invention. Each of the interconnects is tested during a simulation of the PLD.

At step 502, data describing the interconnects to be tested are read from a database. The database may be a database including the interconnection schematics and other schematics of the PLD. The database may be queried to list every interconnection arc of specific representative ones of each type of interconnection element on the PLD. The representative ones of each type of interconnection element on the PLD may be selected in response to user input. The query may include requesting that the list include all user-visible and user-hidden arcs of the specific representative interconnection elements. The list of arcs within the specific representative interconnection elements may specify the programmable interconnects to be tested by process 500.

At step 504, a respective test design is generated for each interconnect. The respective test design may be a modification of an archetypal test design the replaces an interconnect in a hardware description language specification of the test design with the interconnect being tested. The test design for an interconnect being tested may couple an input pad and an output pad of the PLD using the interconnect being tested.

At step 506, a respective configuration for the PLD is generated for each test design. Thus, each of the interconnects being tested may have a respective configuration. Software tools, which possibly have defects, are used to translate each test design into the respective configuration. A test design may be specified in a hardware description language (HDL) and the software tools may translate the HDL specification of the test design into a corresponding configuration.

At step 508, a respective operation is simulated for the PLD programmed with each configuration. For a particular interconnect, the simulation may include simulating the loading of the configuration generated from the test design for the particular interconnect. The simulation may subsequently include providing values to an input of the PLD and capturing values generated at an output of the PLD. Each of the interconnects being tested may have a similar respective simulation.

At step 510, each simulated operation of the PLD is checked for inconsistency. Checking for inconsistency may include determining whether the values generated at an output of the PLD during simulation are consistent with the values provided to an input of the PLD. Finding an inconsistency may indicate the existence of a defect in the design of the PLD and/or the software tools used to translate the test designs into the configurations. Generally, after the cause of a detected defect is determined and fixed, process 500 is repeated until the simulated operation of the PLD ceases to exhibit any inconsistency.

Figure 6:
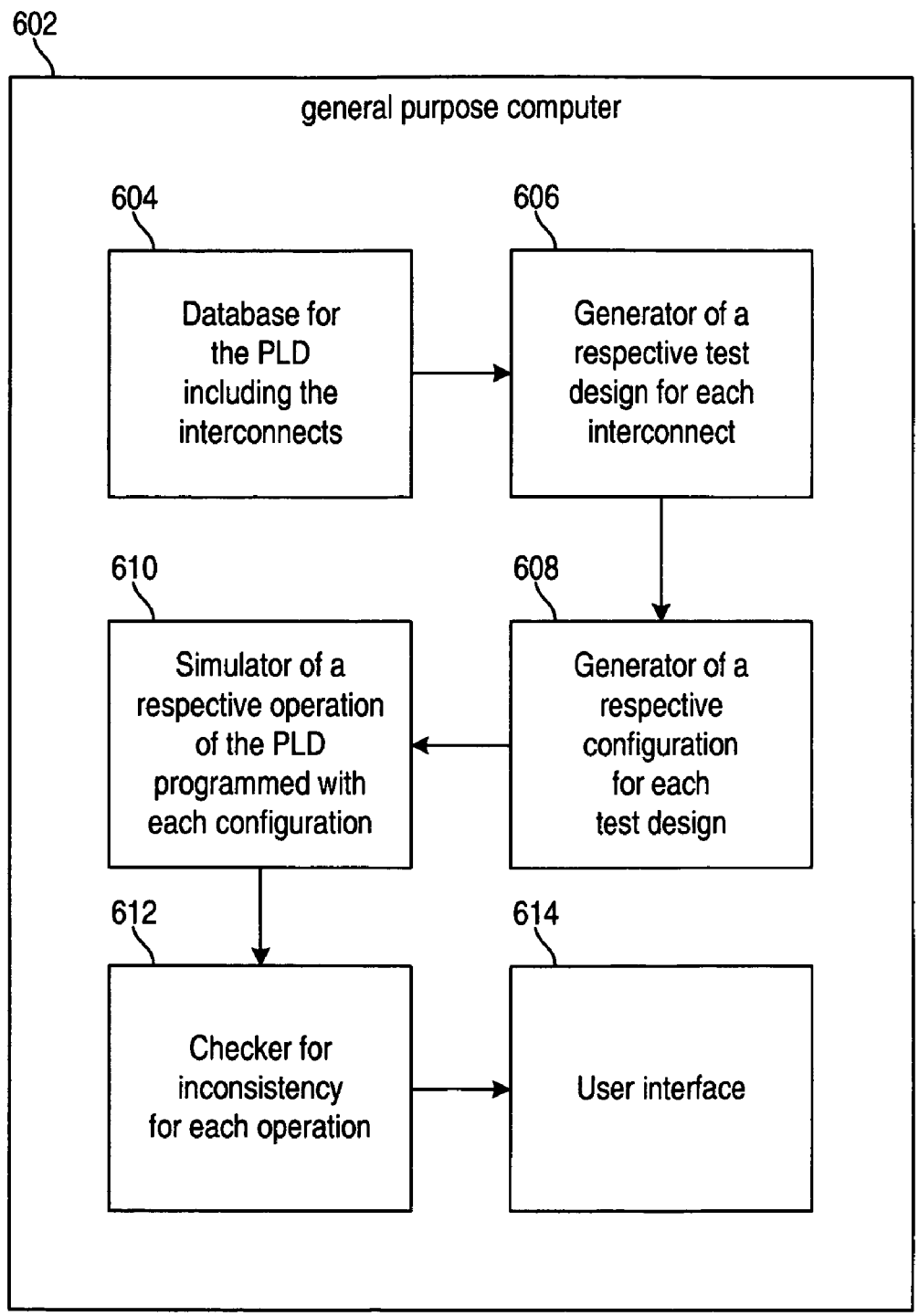
FIG. 6 is a system for testing interconnects of a PLD in accordance with various embodiments of the invention.

FIG. 6 is a system for testing interconnects of a PLD in accordance with various embodiments of the invention. The system may include various software modules executed by one or more general purpose computers 602.

A database 604 may include a specification of all the interconnects for the PLD and possibly other design information for the PLD. A query of the database may produce a list of the interconnects of the PLD to be tested.

A generator 606 software module may generate a respective test design for each interconnect. A generator 608 software module may generate a respective configuration for each test design. A simulator 610 software module may simulate a respective operation of the PLD programmed with each configuration. A checker 612 software module may check for inconsistency of the respective operation for each of the interconnects. A user interface 614 may display an indication of any detected inconsistency.

It will be appreciated that PLDs having different layouts of CLBs, IOBs, and interconnect circuitry (and the functional equivalents thereof) may also implement the various embodiments of the invention described herein.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for testing interconnects of a PLD. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for testing interconnects of a programmable logic device (PLD), comprising:
   reading data descriptive of a subset of interconnects of the PLD from a database;
   wherein the PLD includes a plurality of different types of interconnection elements, and each interconnection element includes a plurality of interconnects;
   selecting a representative one of each type of interconnection element in the PLD, wherein the subset of interconnects includes at least one of the plurality of interconnects from each representative one interconnection element;
   wherein testing of the interconnects is limited to the representative ones of the different types of interconnection elements;
   for each of the interconnects in the subset of interconnects, generating a respective test design that replaces a portion of a coupling between an input pad and an output pad in an archetypal test design with a coupling that includes the interconnect;
   generating from each of the test designs a respective configuration for the PLD;
   simulating for each of the configurations a respective operation of the PLD programmed with the configuration; and
   for each of the operations of the PLD, checking the operation of the PLD for inconsistency with an expected result.

2. The method of claim 1, wherein the subset of interconnects includes at least one of all user-visible and all user-hidden interconnects of the representative one of each type of interconnection element in the PLD.

3. The method of claim 1, wherein the PLD includes a plurality of different types of interconnection elements, and each interconnection element includes a plurality of interconnects, and the subset of interconnects includes all interconnects of at least one of a plurality of interconnection elements.

4. The method of claim 3, wherein the different types of interconnection elements include interior interconnection elements, termination interconnection elements, and test interconnection elements.

5. The method of claim 4, wherein the subset of interconnects are all interconnects of one of the interior interconnection elements, all interconnects of one of the termination interconnection elements, and all interconnects of one of the test interconnection elements.

6. The method of claim 1, wherein the respective test design comprises a first register coupled to the input pad, a second register coupled to the output pad, and an interconnect coupling the first and second registers.

7. The method of claim 1, wherein the test design includes a specification in a hardware description language.

8. The method of claim 7, wherein the generating the respective configuration for the PLD from the test design includes translating the specification into the respective configuration.

9. The method of claim 8, wherein the translating uses an interconnection model that models the interconnects.

10. The method of claim 1, wherein the simulating the respective operation of the PLD programmed with the configuration includes behaviorally simulating a specification in a hardware description language of the PLD.

11. The method of claim 10, wherein the behaviorally simulating includes simulating programming of the PLD with the configuration.

12. The method of claim 1, wherein the checking the operation of the PLD for inconsistency includes checking for inconsistency between values generated at the output pad and values provided to the input pad.

13. The method of claim 1, further comprising isolating, in response to the inconsistency, a defect in at least one of a specification of the PLD and the automatically generating of the respective configuration for the PLD.

14. The method of claim 13, wherein the isolating includes isolating the defect in an interconnection model that models the interconnects and is used in the generating of the respective configuration for the PLD.

15. The method of claim 1, further comprising, for each of the configurations, programming and operating the PLD with the configuration, and checking the operating of the PLD.

16. A system for testing interconnects of a programmable logic device (PLD), comprising:
   a computer configured to include,
      a database for the PLD including data descriptive of the interconnects;
      wherein the PLD includes a plurality of different types of interconnection elements, and each interconnection element includes a plurality of interconnects;
      a first generator coupled to the database, the first generator configured to read data descriptive of a subset of the interconnects from the database and generate a respective test design for each of the subset of interconnects that replaces a portion of a coupling between an input pad and an output pad in an archetypal test design with a coupling that includes the interconnect;
      wherein the first generator further selects a representative one of each type of interconnection element in the PLD, and the subset of interconnects includes at least one of the plurality of interconnects from each representative one interconnection element;
      wherein testing of the interconnects is limited to the representative ones of the different types of interconnection elements;

a second generator coupled to the first generator, the second generator configured to generate a respective configuration for the PLD from each of the test designs;

a simulator configured to simulate a respective operation of the PLD programmed with each of the configurations; and a checker coupled to the simulator and configured to check for inconsistency of each of the operations of the PLD from an expected result, wherein, in response to the inconsistency, an indication of the inconsistency is displayed to a user.

17. The system of claim 16, wherein the first generator generates the respective test design that includes a first register coupled to the input pad, a second register coupled to the output pad, and the interconnect coupling the first and second registers.

18. The system of claim 16, wherein the checker checks for the inconsistency between values at the output pad and values at the input pad.

19. A system for testing interconnects of a programmable logic device (PLD), comprising:

means for reading data descriptive of a subset of the interconnects from a database for the PLD;

wherein the PLD includes a plurality of different types of interconnection elements, and each interconnection element includes a plurality of interconnects;

means for selecting a representative one of each type of interconnection element in the PLD, and the subset of interconnects includes at least one of the plurality of interconnects from each representative one interconnection element;

wherein testing of the interconnects is limited to the representative ones of the different types of interconnection elements;

means for generating, for each of the interconnects in the subset of interconnects, a respective test design that replaces a portion of a coupling between an input pad and an output pad in an archetypal test design with a coupling that includes the interconnect;

means for generating, for each of the test designs, a respective configuration for the PLD from the test design;

means for simulating, for each of the configurations, a respective operation of the PLD programmed with the configuration; and means for checking, for each of the operations of the PLD, the operation of the PLD for inconsistency with an expected result.

* * * * *